US008010917B2

(12) United States Patent
Cross et al.

(10) Patent No.: US 8,010,917 B2
(45) Date of Patent: Aug. 30, 2011

(54) METHOD AND SYSTEM FOR IMPLEMENTING EFFICIENT LOCKING TO FACILITATE PARALLEL PROCESSING OF IC DESIGNS

(75) Inventors: David Cross, San Jose, CA (US); Eric Nequist, Monte Sereno, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 455 days.

(21) Appl. No.: 11/964,681

(22) Filed: Dec. 26, 2007

(65) Prior Publication Data

US 2009/0172623 A1 Jul. 2, 2009

(51) Int. Cl.
*G06F 17/50* (2006.01)
(52) U.S. Cl. .............. 716/100; 716/53; 716/54; 716/55; 716/101; 716/104; 716/110; 716/118; 716/119; 716/139; 716/107; 712/9; 712/10; 712/11; 712/15; 718/102; 718/103; 718/104; 718/105; 718/106
(58) Field of Classification Search .................. 716/1–3, 716/8–11, 53–55, 100–101, 104, 110, 118–119, 716/139; 712/9–15; 718/102–107
See application file for complete search history.

(56) References Cited

U.S. PATENT DOCUMENTS

| 6,144,983 | A | * | 11/2000 | Klots et al. ..................... 718/104 |
| 6,711,718 | B2 | | 3/2004 | Pfeil et al. |
| 6,983,440 | B1 | * | 1/2006 | Nequist ......................... 716/139 |
| 7,461,359 | B1 | * | 12/2008 | Nequist ......................... 716/126 |
| 2004/0019679 | A1 | * | 1/2004 | E et al. ........................ 709/226 |
| 2004/0210854 | A1 | | 10/2004 | Pfeil et al. |
| 2004/0225988 | A1 | | 11/2004 | Petunin et al. |
| 2005/0044518 | A1 | | 2/2005 | Petunin et al. |
| 2006/0265675 | A1 | * | 11/2006 | Wang ............................... 716/5 |

OTHER PUBLICATIONS

Schafer et al. "Deadlock-Free Routing and Component Placement for Irregular Mesh-based Networks-on-Chip", Proceedings of the 2005 IEEE/ACM International Conference on Computer-Aided Design, Nov. 6-10, 2005.
Qiao et al. "Data Driven Design and Simulation System Based on XML", Proceedings of the 2003 Winter Simulation Conference, pp. 1143-1148.
Durbeck et al. "Defect-tolerant, fine-grained parallel testing of a Cell Matrix", Proceedings of SPIE, Jul. 2002, Boston MA, pp. 238-245.

* cited by examiner

*Primary Examiner* — Nghia M Doan
(74) *Attorney, Agent, or Firm* — Vista IP Law Group, LLP

(57) ABSTRACT

Disclosed is an improved method and system for implementing parallelism for execution of electronic design automation (EDA) tools, such as layout processing tools. Examples of EDA layout processing tools are placement and routing tools. Efficient locking mechanism are described for facilitating parallel processing and to minimize blocking.

12 Claims, 17 Drawing Sheets

Goto Figure 4M

METHOD AND SYSTEM FOR IMPLEMENTING EFFICIENT LOCKING TO FACILITATE PARALLEL PROCESSING OF IC DESIGNS

FIELD

The invention relates to the design and manufacture of integrated circuits, and more particularly, to systems and methods for performing parallel processing of circuit components during the circuit design process.

BACKGROUND

The invention relates to the design and manufacture of integrated circuits, and more particularly, to systems and methods for performing parallel processing of circuit components during the circuit design process.

A semiconductor integrated circuit (IC) has a large number of electronic components, such as transistors, logic gates, diodes, and wires, which are fabricated by forming layers of different materials and of different geometric shapes on various regions of a silicon wafer.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist.

As the quantity of data in modern IC designs become larger and larger over time, the execution time required to process EDA tools upon these IC designs also becomes greater. For example, the more transistors and other structures on an IC design the greater amounts of time that is normally needed to perform placement and routing operations for that design. This problem is exacerbated for all EDA tools by constantly improving IC manufacturing technologies that can create IC chips at ever-smaller feature sizes, which allows increasingly greater quantities of transistors to be placed within the same chip area, as well resulting in more complex physical and lithographic effects during manufacture that need to be considered.

To achieve faster results, it is therefore desirable to perform EDA processing upon an IC layout using multi-processing approaches, e.g., concurrent or parallel processing. Parallel processing (also referred to as parallel computing) is a form of computing in which multiple operations are carried out simultaneously, or in "parallel." Parallel computing operates on the principle that large problems can be divided into smaller ones, with each smaller problem addressed by individual processing units concurrently. Examples of systems that support parallel processing include multi-CPU/processor computers and distributed processing systems having multiple networked nodes. For example, for EDA tools, the process of designing a layout for an IC design may implemented in parallel by dividing the layout into separate partitions, and having separate processing units handle the placement and routing operations for each individual partition in the layout.

There are, however, significant obstacles for EDA vendors that wish to implement a parallel processing solution for IC layouts. Many of the obstacles relate to the need to take data dependencies and data conflicts into account to make sure that a first processing unit does not perform operations that negatively affect the data operated upon by a second processing unit.

One conventional EDA approach to address this problem is to utilize switchboxes to partition the layout. The switchbox is a partitioned unit of the layout that essentially appears as a black box to other portions the layout. A defined interface is used to connect the switchbox to the rest of the layout. Since the switchbox appears as a black box to the rest of the layout, the inner portions of the layout within the switchbox can therefore be processed independently of the other portions of the layout. As such, multiple switchboxes can be processed in parallel with minimal concerns of data conflicts. The problem with this approach is that there is a high cost to the process of stitching a switchbox to another portion of the layout. Under certain circumstances, those excessive costs to integrate the switchboxes could seriously diminish the potential benefits of using the switchboxes in the first place.

Therefore, there is a need for an improved approach to implement parallelization for EDA processing that avoids the high cost of existing approaches.

SUMMARY

Embodiments of the invention provide an improved method and system for implementing parallelism for execution of electronic design automation (EDA) tools, such as layout processing tools. Examples of EDA layout processing tools are placement and routing tools. Efficient locking mechanisms are described for facilitating parallel processing and to minimize blocking.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE FIGURES

The accompanying drawings are included to provide a further understanding of the invention and, together with the Detailed Description, serve to explain the principles of the invention.

DETAILED DESCRIPTION

Figure 1:
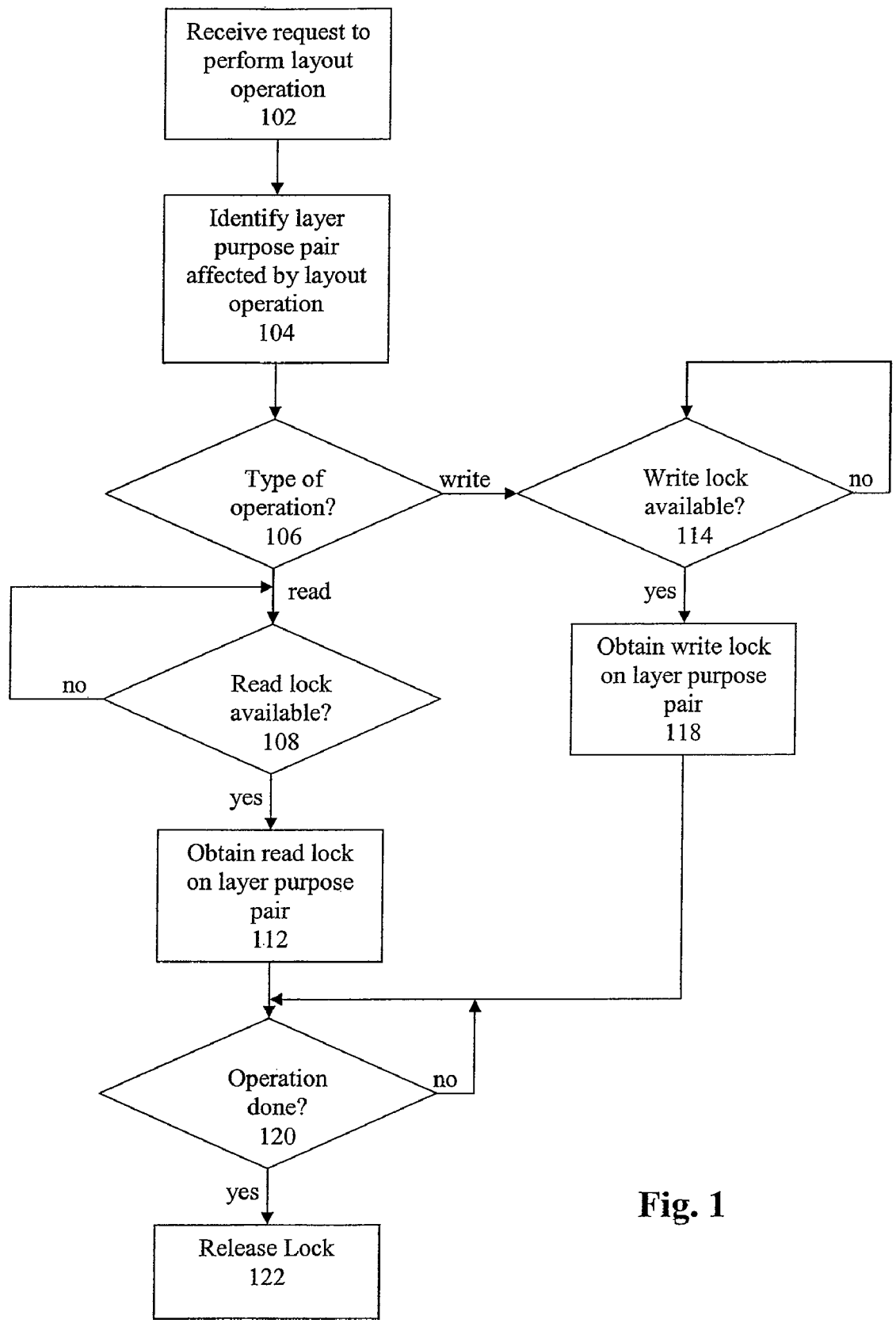
FIG. 1 shows an approach for locking with layer purpose pairs according to an embodiment of the invention.

Disclosed is an improved method and system for implementing parallelism for execution of electronic design automation (EDA) tools, such as layout processing tools. Examples of EDA layout processing tools are placement and routing tools. To illustrate embodiments of the invention, the below description is made with respect to parallelism for layout-related tools. It is noted, however, that the present invention is not limited to layout-related tools, and may also be applied to other types of EDA tools.

The embodiments of the invention may be used in conjunction with any type of parallel processing or computing system. For example, the invention may be employed in conjunction with multi-CPU or multi-processor computers (such as symmetric multiprocessing or massively parallel processing systems), distributed processing systems having multiple networked nodes, multi-core computers, and grid-based computing systems. Any type of execution or processing unit may be used to implement the invention, including processing units such as threads, processes, and tasks. Illustrative examples of the invention may be described herein with respect to specific types of computing systems or processing units (e.g., threads). It is noted, however, that the invention may be employed with any type of computing system or processing unit and is not to be limited to a specifically disclosed type of processing system or unit unless so claimed.

Embodiments of the invention utilize locks to implement parallelism. A lock is a synchronization mechanism used by software programs to enforce or restrict access to resources within the computing system. For example, an advisory lock is a functional category of locks where each thread cooperates by acquiring the lock before accessing the corresponding data. The lock may correspond to different modes of operation. For example, there may be read locks, write locks, read-write locks, or general locks that make no distinction between reads and writes. Locks may be shared among multiple processing entities, or exclusively held by a single processing entity.

There are numerous types of lock mechanisms that can be employed in conjunction with the invention. A semaphore is a fairly standard type of lock that flags whether a re source is available (free) or unavailable (locked). A spinlock is a lock type where the thread simply waits ("spins") until the lock becomes available. The spinlock is very efficient if threads are only likely to be blocked for a short period of time, as it avoids the overhead of operating system process re-scheduling.

The problem with using locks is that it can cause blocking in the computing system. For example, consider if it is desired to implement parallel processing for the tasks of adding or modifying circuit elements on a layout. Multiple threads may be operating in parallel, with a first thread seeking to act upon circuit elements or layout portions that are also be being acted upon by a second thread. To avoid data conflicts, the first thread may need to exclusively lock some or all of the data that it is operating upon. While the first thread is holding the exclusive lock, the second thread may be blocked from accessing the locked resources.

Embodiments of the present invention provide improved approaches for implementing locks that significantly reduce blocking problems. Locking is performed at efficient levels of granularities such that both blocking and conflicts are minimized when operating upon a circuit design.

According to some embodiments, a first approach to implant locking is to lock the IC design at the "layer purpose-pair" level. According to some implementations of EDA tools and EDA data representations, shapes on a layout have an associated "layer" and "purpose." The layer refers to a physical layer within the IC design, which often translates to a mask layer. The purpose is a user-definable specification of a category of objects within the layout, such as a "wire purpose," via purpose," or "blockage purpose." At alternate levels of granularity, a design group might want to distinguish power, ground, clock, and signal lines as different purposes. Inside the structure for the IC design, a layer-purpose pair would be the combination of layer and purpose as a single object that is used to organize shapes or objects on the layout. This allows applications to traverse the shape data by layer and purpose taken together, by layer alone, or all shapes in a given cell. Since purposes are definable, the control of its use is flexible and different combinations can be implemented depending upon the specific applications and/or users involved with the design. One example approach that is usable in conjunction with the invention to implement data and databases for layer-purpose pairs is described by the OpenAccess standard, which includes an IC design/implementation API and reference database, the description of which is available at http://www.Si2.org.

Each physical layer within the IC design includes multiple purpose-pairs, with the purpose pairs essentially forming a virtual or logical layer/component of the physical layer. For example, consider a design in which a metal layer is defined to include a "wire" purpose pair, a "via" purpose pair, and a "blockage" purpose pair. The physical metal layer would include the design data for all of these purpose pairs.

Instead of using a single lock for an entire layer or for the entire IC design, the present embodiment utilizes locks that correspond to a given purpose pair—with each purpose pair corresponding to its own lock. If a metal layer has three purpose pairs, then that metal layer has three purpose pair locks. When a processing unit needs to lock resources in an IC design, it will lock at the purpose pair level. This reduces the granularity of the locking that occurs for an IC layout, and given enough purpose pairs and layers in the design, effectively minimizes blocking between executing threads.

FIG. 1 shows a flowchart of this first approach for implementing parallel processing in an EDA system according to some embodiments of the invention. At 102, the process receives a request to perform an operation upon a layout. For example, the operation may pertain to a placement or routing operation that adds or modifies a shape or object on the layout. It is assumed that the operation is being performed in a parallel processing environment where there are multiple threads of execution that are concurrently being processed.

At 104, identification is made of the layer purpose pair affected by the desired layout operation. This action identifies the layer and the specific purpose pair for that layer which is being acted upon by the layout operation.

If locking is employed that distinguishes between read locks and write locks, then a determination is made at 106 regarding whether the layout operation is needs to take a read lock or a write lock on the resource associated with the identified layer purpose pair. This determination is based upon the type of exclusivity needed for the layout operation. If the layout operation is merely performing read operations, then the thread may only need to take a shared read lock on the layer purpose pair. On the other hand, if the layout operation is going to modify the data in a manner that could cause potential data conflict or inconsistencies for other concurrent users of the data, then it may be desirable to obtain an exclusive write lock on the layer purpose pair. It is noted that in some alternative embodiments, locks are employed that are not specific to the type of exclusivity that requires different write and read locks.

If the operation requires a write lock, then a determination is made at 114 whether the write lock for the layer purpose pair is available. The write lock may be unavailable if, for example, a read or write lock is already being held by another thread for the identified layer purpose pair. If unavailable, then the request for the write lock will be queued until the lock is available or unless the present request has sufficient priority to change the lock status of the prior locking by other threads for the layer purpose pair. Once the write lock is available, then at 118 the write lock is obtained by the thread for the layer purpose pair.

If the operation requires a read lock, then a determination is made at 108 whether the read lock for the layer purpose pair is available. The read lock may be unavailable if, for example, a write lock is already being held by another thread for the identified layer purpose pair. If unavailable, then the request for the read lock will be queued until the read lock becomes available or unless the present request has sufficient priority change the lock status of the prior locking by other threads for the layer purpose pair. If another thread has an existing sharable read lock, then it is likely that the present request for a read lock will be concurrently granted. Once the read lock is available, then at 112 the read lock is obtained by the thread for the layer purpose pair.

Once the appropriate lock has been obtained, the thread will perform its layout operations upon the objects on the layer corresponding to the layer purpose pair. When the layout operation has completed its processing (120), then the lock is released by the thread (122).

Figure 2:
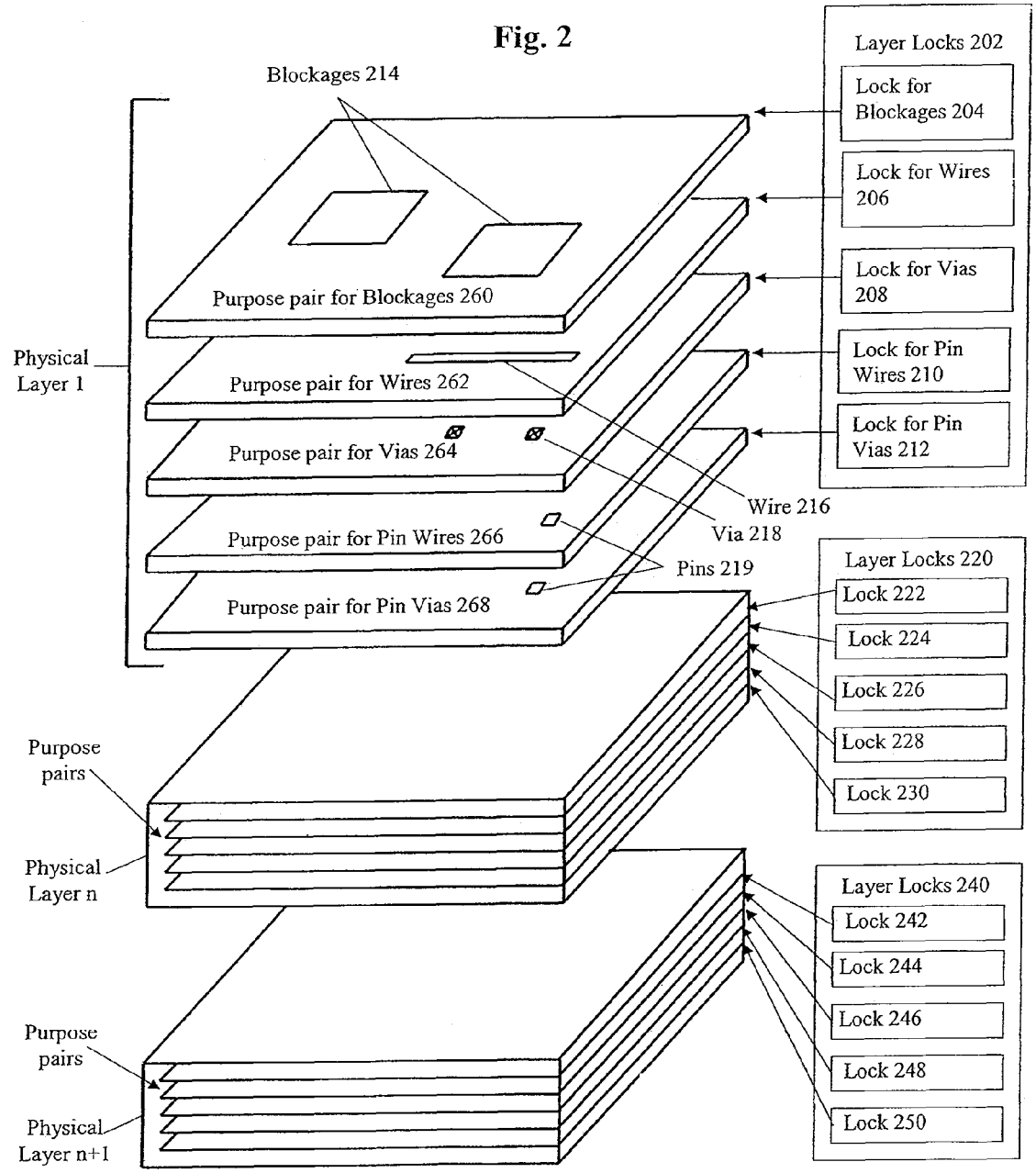
FIG. 2 illustrates layer purpose pair locks according to an embodiment of the invention.

FIG. 2 illustrates an example implementation of locking at the layer purpose pair level according to some embodiments of the invention. This figure shows representations for several physical layers, including physical layers 1, n, and n+1. Each physical layer is associated with multiple purpose pairs. For example, physical layer 1 is associated with purpose pair 260 for blockages. This purpose pair 260 is used to manage design data for blockages 214 that exist within physical layer 1. Physical layer 1 is also associated with purpose pair 262 for wire structures. This purpose pair 262 is used to manage design data for wires 216 that exist within physical layer 1. In addition, a purpose pair 264 is associated with physical layer 1 for vias. This purpose pair 264 is used to manage design data vias 218 on physical layer 1. Purpose pairs 266 and 268 are used to handle design data for pin wires and pin vias, respectively, relative to pins 219.

A set 202 of layer locks is used to handle locking for these purpose pairs, with each purpose pair associated with its own lock. In this example, purpose pair 260 is associated with lock 204, purpose pair 262 is associated with lock 206, purpose pair 264 is associated with lock 208, purpose pair 266 is associated with lock 210, and purpose pair 268 is associated with lock 212.

Each of the purpose pairs for the other physical layers would also be associated with their own purpose locks. For physical layer n, the purpose pairs for this physical layer are associated with a set 220 of layer locks comprising locks 222, 224, 226, 228, and 230. Similarly, for physical layer n+1, the purpose pairs for this physical layer are associated with a set 240 of layer locks comprising locks 242, 244, 246, 248, and 250.

When a thread is seeking to operate upon layout objects, any locks that it obtains will be specific to the layer purpose pair of the objects that it will be adding or modifying. For example, assume that a given thread is performing a layout operation that will involve modification of wires on physical layer 1. In this situation, the thread will obtain lock 206 on purpose pair 262 before making the desired modification of the wires. This will prevent other threads from performing inconsistent changes or accesses to the wire data on physical layer 1.

This approach provides very good performance and scaling for parallel processing since it effectively partitions the physical layers into multiple different virtual layers, with each virtual layer corresponding to a layer purpose pair. By holding locks on the layer purpose pairs, this approach significantly reduces the probability of blocking in a parallel computing system. For example, in a system having 10 layers with 5 purpose pairs per layer, this means that there are at least 50 layer purpose pair locks that can be taken by threads. Assuming random distribution of operations across the layout, then there is only a 1 in 50 chance of blocking (or some small factor of this number) given a small enough number of concurrent threads.

A possible drawback exists, however, with this approach if the concurrent layout operations are not randomly distributed across the layout. This is because the granularity of the layer purpose pair may still be too coarse for parallel processing if the layout operations are systematically distributed across the same set of layer purpose pairs. For example, consider the layout operations that are used to perform pin escapes. It is quite likely that pin escape operations will cause concurrent threads to want to seek locks on the same small sets of layer purpose pairs.

An alternate embodiment of the invention is directed at an approach in which locks are provided at the "zone tree" and "zone slice" levels for a layout. Zone trees and zone slices are structures that can be used to manage information relating to shapes or objects on a layout. A given region of a circuit design having a set of geometric elements is represented as a "zone forest," with each zone forest containing geometric elements on multiple layers. A layer of the zone forest is represented as a zone tree. A zone tree can be partitioned into multiple zone slices or with each slice comprising a portion of the zone tree. A slice may be a set of intervals, which may be disjoint, along a common axis. The set of disjoint intervals may be sparse. Also, if the set of disjoint intervals is in a collection of sets of disjoint intervals, the common axis for the set of disjoint intervals may be perpendicular to the common axis for the collection of sets of disjoint intervals. Any slice orientation may be employed, e.g., to form vertical or horizontal slices. The coverage area of zone slices within a zone tree can have differing size and dimensions. In addition, objects may span across multiple slices. Objects are mapped to line segments within a zone slice. This is done by intersecting the object with the zone slice and then computing the projection of this intersection onto the slice's common axis. One or more structures are maintained for each zone slice to track the geometric objects associated with the zone slice. A representation of an object may include a pointer to the memory location of the corresponding object that is stored in a database. A stored object may include information such as space tiles, guides, geometric connectivity, range searching, wires, or other components, for example.

According to some embodiments, the invention can be applied to systems in which a separate zone tree is employed for each purpose pair. One example approach for implementing zone trees and zone slices is disclosed in U.S. Pat. No. 7,100,128, which is hereby incorporated by reference in its entirety.

According to a present embodiment of the invention, layout operations may be performed by obtaining locks at the granularity of a zone slice. Each slice corresponds to a small enough region of the layout such that it is highly unlikely blocking will occur. If fast enough locks are used for the zone slices, such as spinlocks, then the cost of using a large number of locks corresponding to the different zone slices will be cheap enough to provide fast performance and efficient scaling. In this manner, even non-random layout operations will not cause excessive blocking in a parallel computing system.

In certain implementations of zone trees and zone slices, it is possible that layout operations will cause a real-time requirement to change the type, size, or scope of the underlying data or data structures for the representations of zone trees and/or zone slices. For example, consider if there is a size limitation configured for a zone slice, and a requested layout operation will cause entry or modification of layout objects sufficient to make the zone slice exceed its size limitation. In this situation, it is possible that the zone slice will need to be split and/or that a new zone slice will need to be created to hold the excess amount of data. In this circumstance, it is possible that additional locks may need to be held to make the required structural modifications to data structures to account of the split and/or creation of new slices.

Figure 3:
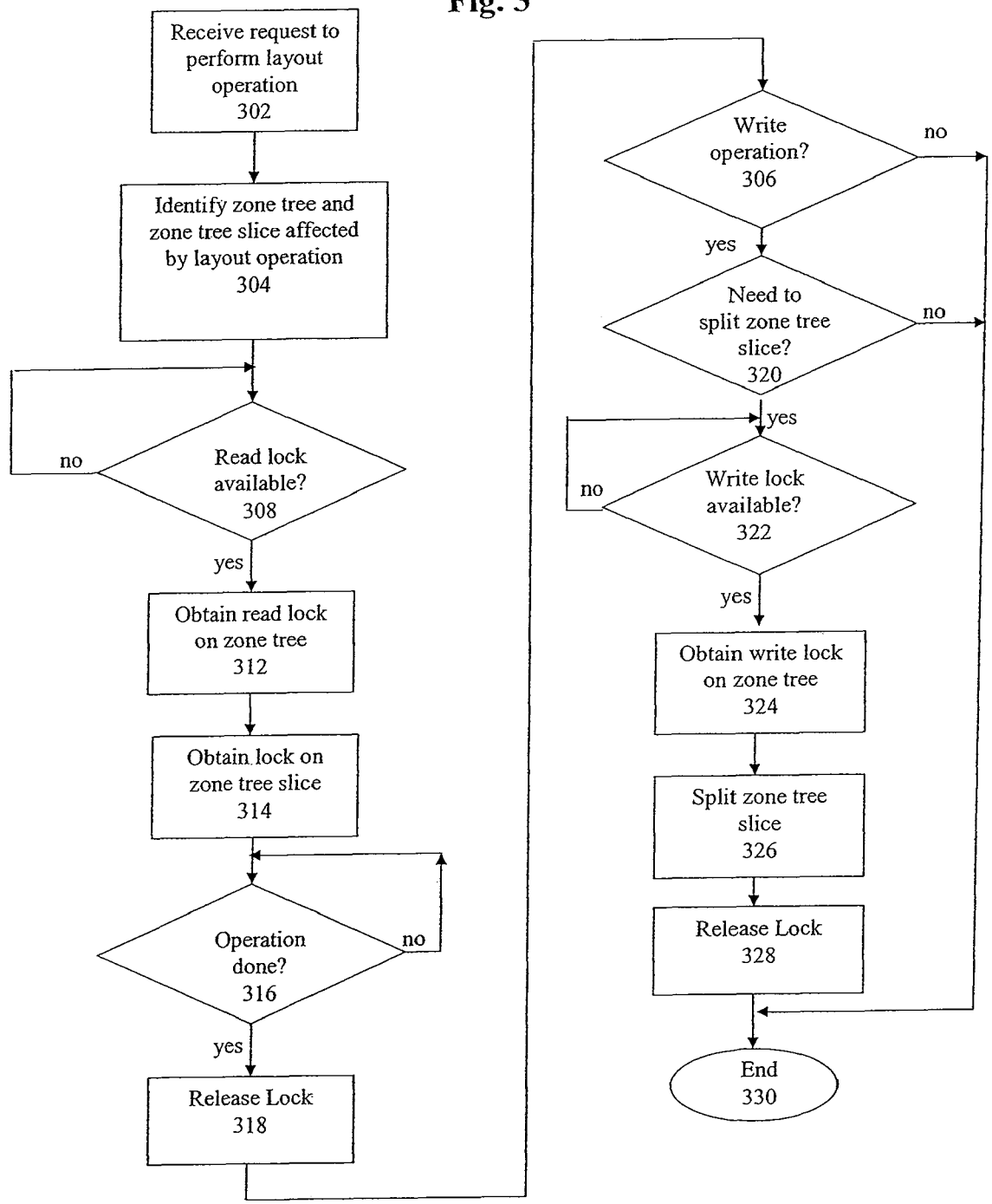
FIG. 3 shows an approach for locking with trees and slices according to an embodiment of the invention.

FIG. 3 is a flowchart of one example approach for handling locking at the slice level, where the example approach is capable of addressing splits and/or additions of structures to hold additional data items for layout objects. In this example, it is assumed that the zone slices correspond to individual locks. A lock is also employed to lock the entire zone tree if there is the need to split a zone slice. If a zone slice does not need to be split, then it is assumed that only a read lock is needed for the zone tree. Spin locks may be employed to lock the individual zone slices.

At 302, the process receives a request to perform an operation upon a layout. For example, the operation may pertain to a placement or routing operation that adds or modifies a shape or object on the layout. It is assumed that the operation is being performed in a parallel processing environment where there are multiple threads of execution that are concurrently being processed.

At 304, identification is made of the zone tree (e.g., layer) and zone slice (e.g., region of zone tree) affected by the desired layout operation. A suitable approach for performing look-up operations to implement this action is described in U.S. Pat. No. 7,100,128, which is hereby incorporated by reference in its entirety.

An attempt will then be made to obtain a read lock on the zone tree. The purpose of the lock on the zone tree is to make sure that a structural change is not made to the zone tree by another thread while the present operation is being performed. Therefore, the requesting thread will request a shared read lock. According to some embodiments, the read lock is requested even if the thread is performing write operations (as opposed to just read operations). If the thread is performing a write operation, but the write operation will not cause a zone slice to split, then it is considered equivalent to a read operation for locking purposes according to the present embodiment because the write operation (like the read operation) will not cause structural changes to the zone tree. Therefore, with this assumption in mind, the operation will initially only take a read lock on the zone tree, regardless of whether it is performing read operations, write operations, or mixed read/write operations. The advantage of this approach is that it significantly minimizes the circumstances under which an exclusive write lock exists that will block other threads.

A determination is made at 308 whether the read lock for the zone tree is available. The read lock may be unavailable if, for example, a write lock is already being held by another thread for the zone tree. If unavailable, then the request for the read lock will be queued until the read lock becomes available or unless the present request has sufficient priority change the lock status of the prior locking by other threads for the zone tree. If another thread has an existing sharable read lock, then it is likely that the present request for a read lock will be concurrently granted. Once the read lock is available, then at 312 the read lock is obtained by the thread for the zone tree.

The thread can obtain a lock on the zone slice to perform the desired layout operation for operations within the slice (314). According to some embodiments, the lock on the zone slice is implemented as an exclusive spin lock. Therefore, if another thread is already actively holding a lock on the slice, the lock request is queued until the lock becomes available to be taken by the present thread.

Once the appropriate lock(s) have been obtained, the thread will perform its layout operations upon the objects in the slice. When the layout operation has completed its processing (316), then the lock(s) are released by the thread (318).

At 306, a determination is made regarding whether the layout operation had performed any write operations, or whether it had just performed read operations. If the thread had performed write operations, then it is possible that the operations made a change in the layout sufficient to cause a requirement to split a zone slice. Therefore, assuming that there has been a write operation, a determination is made at 320 whether the write operation caused a sufficient change in the design such a zone slice will need to be split. This may occur, for example, if additional objects are added to a slice such that it causes the slice to exceed any threshold size or volume limitations that have been established.

According to some embodiments, a split of a zone slice will cause a structural change to occur for the zone tree. To make the structural change, a write lock would be taken to make sure that the structural change does not cause any data inconsistencies, data conflicts, or data access issues for other threads in the system.

If the operation causes a requirement to split a zone tree (320), a determination is made at 322 whether the write lock for the zone tree is available. The write lock may be unavailable if, for example, a read or write lock is already being held by another thread for the zone tree. If unavailable, then the request for the write lock will be queued until the lock is available or unless the present request has sufficient priority change the lock status of the prior locking by other threads for the zone tree. Once the write lock is available, then at 324 the write lock is obtained by the thread for the zone tree. The zone tree slice can then be split at 326.

When a zone slice has been split, locks need to be associated with the resulting zone slices. According to one embodiment, the slices are split by merely adding a new slice and shifting some of the objects from the old slice to the new slice, resulting in a total of two slices in the place of the one original slice. In this approach, the lock that is already associated with the original slice is still associated with the original slice, with a new lock being created for the new slice. According to an alternate embodiment, the slice is split by creating two new slices, with the objects within the old slice shifted as appropriate to the two new slices. In this alternate approach, the original lock is discarded, and two new locks are created to be associated with the two new slices.

Once the operations have been completed to split the slice, the exclusive write lock on the zone tree can be released (328).

Figure 4A:
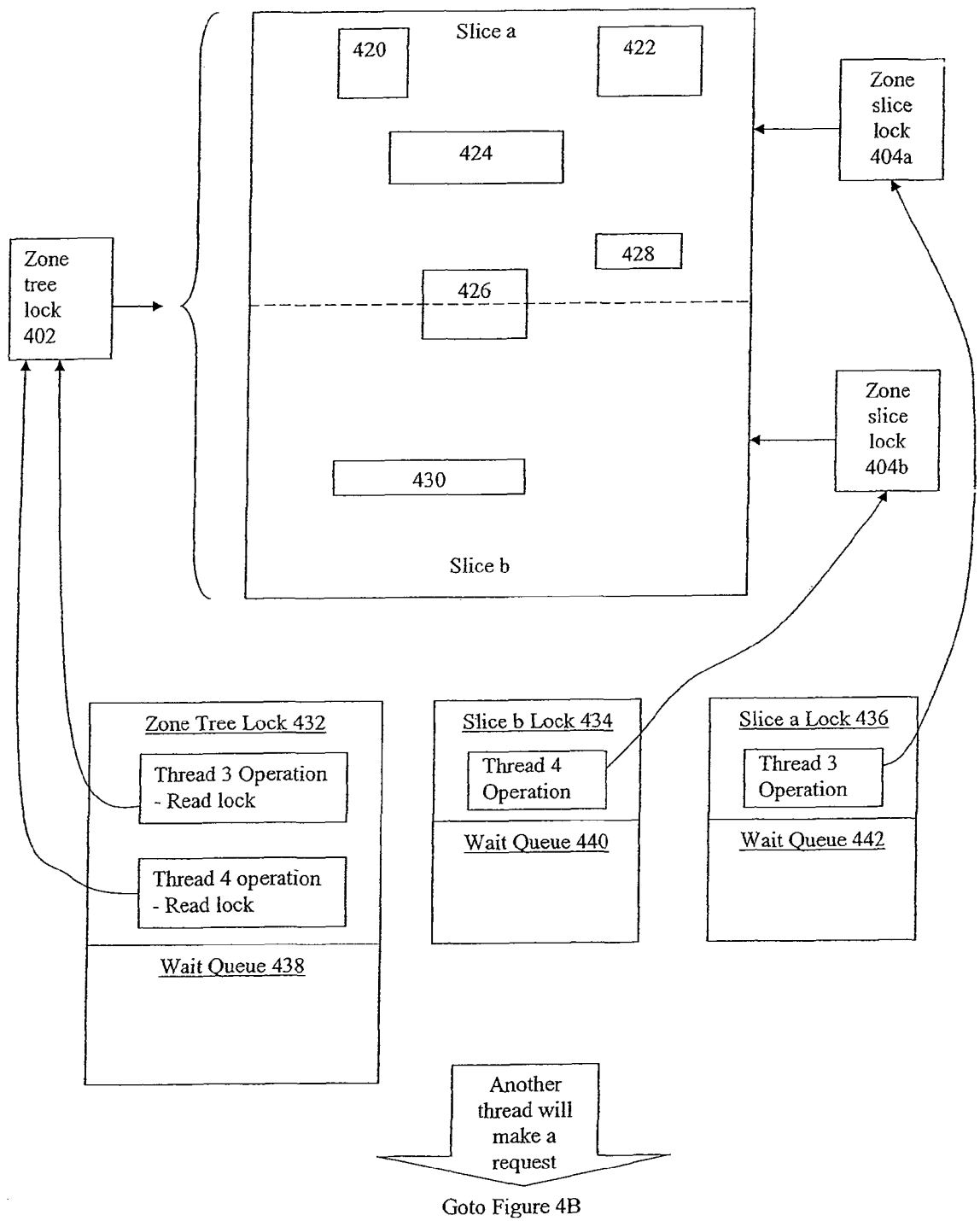
FIGS. 4A-M illustrate locking according to an embodiment of the invention.

To illustrate this embodiment of the invention, reference will now be made to the zone tree and slice configuration shown in FIG. 4A. This figure shows two zone slices a and b within the zone tree. Slice a includes objects 420, 422, 424, and 428. Slice b includes an object 430. Object 426 is split between slice a and slice b.

A zone slice lock 404a is associated with zone slice a. Section 436 identifies the present thread that holds the lock 404a for zone slice a. A wait queue 442 exists to queue requests from threads that are seeking to obtain lock 404a on zone slice a.

Similarly, a zone slice lock 404b is associated with zone slice b. Section 434 identifies the thread that is presently holding lock 404b on zone slice b. A wait queue 440 exists to queue requests from threads that are seeking to obtain lock 404b on zone slice b.

A zone tree lock 402 is associated with the zone tree that encompasses zone slices a and b. Section 432 identifies the thread or threads that are presently holding a lock 402 on the zone tree. A wait queue 438 exists to queue requests from threads that are seeking to obtain lock 402 on the zone tree.

In this illustrative example, two threads are actively holding locks on zone slices a and b. In particular, thread 3 has obtained the lock 404b on zone slice b and thread 4 has obtained the lock 404a on zone slice a, as shown in sections 434 and 436, respectively. Both threads 3 and 4 have also obtained shared read locks 402 on the zone tree lock, as shown in section 432.

Figure 4B:
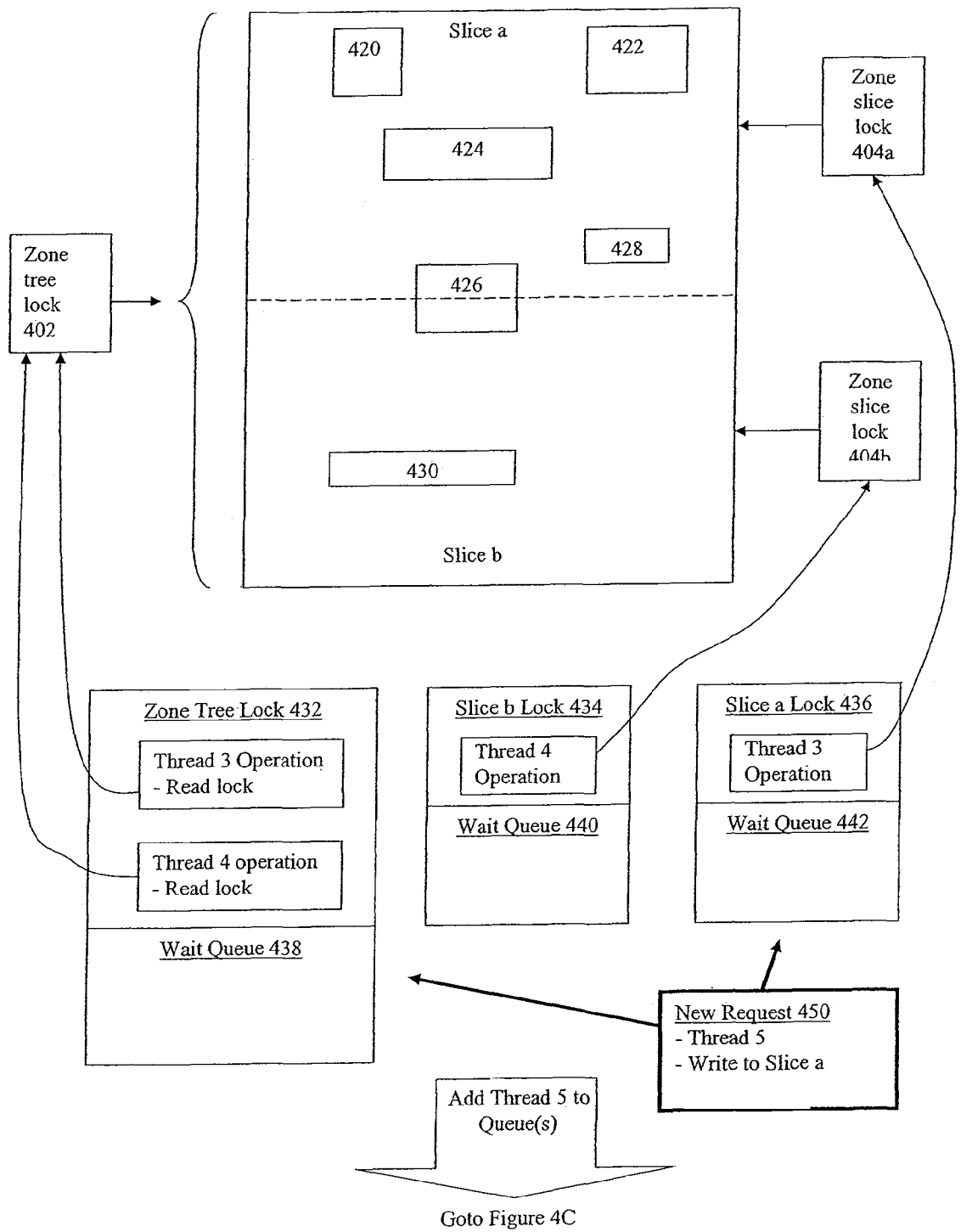
Figure 4C:
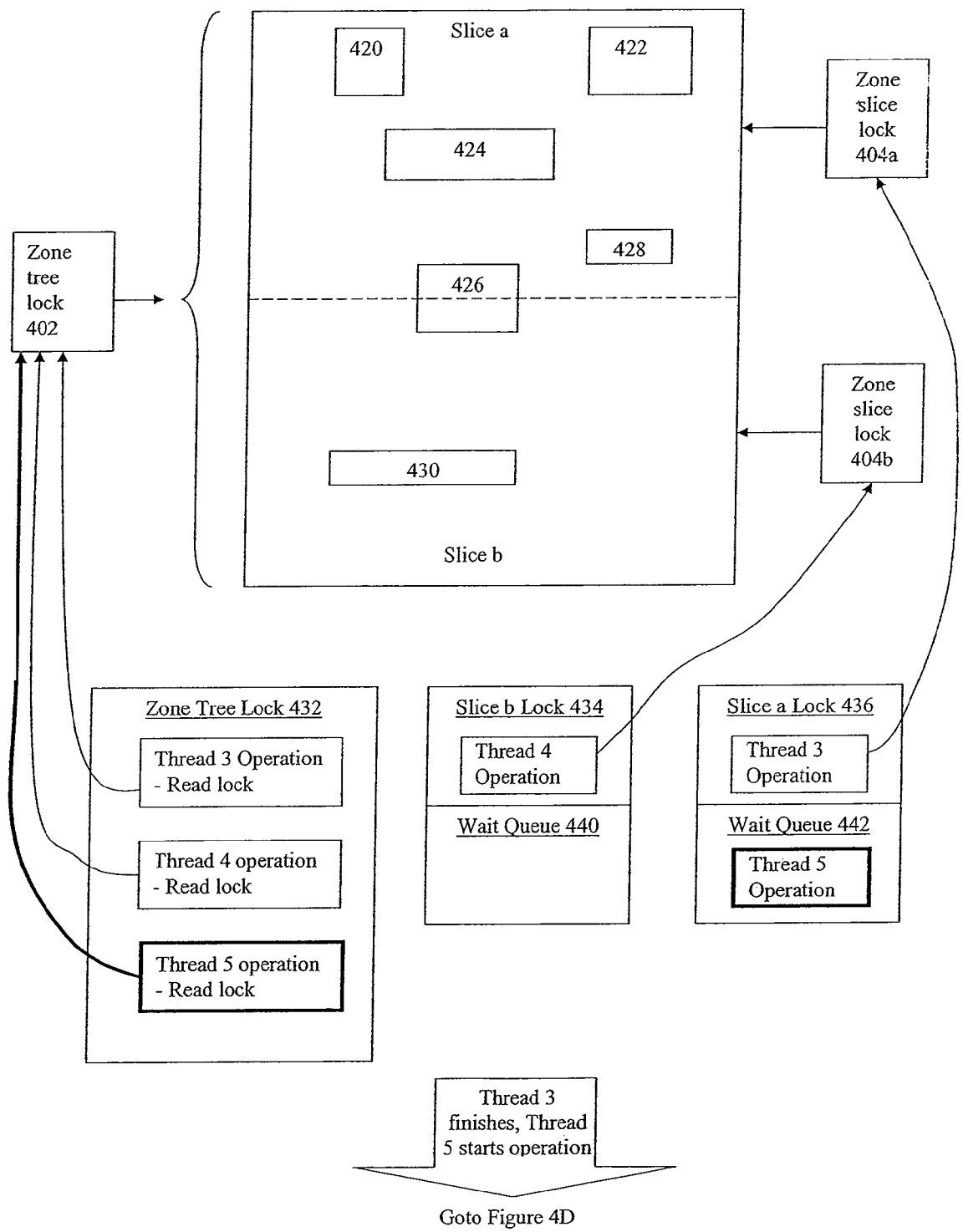

Consider if another thread submits a request to obtain a lock. As shown in FIG. 4B, a new request 450 is submitted by thread 5 to perform a write operation within slice a. When this happens, as shown in FIG. 4C, thread 5 will take a shared read lock 402 to the zone tree.

Here, thread 5 is requesting a read lock on the zone tree even though it is performing a write operation. As previously noted for the present embodiment, even if the thread is performing a write operation a read lock will be requested for the zone tree because it is yet unknown whether the write operation will cause a zone slice to split; therefore, it is possible that operation will end up being equivalent to a read operation from a locking point of view, which would only require a shared read lock to be obtained for the zone tree. However, as described further below, once the system recognizes that a split is required, then a new request will be added to the zone tree queue to obtain a write lock. The advantage of this approach is that it significantly minimizes the circumstances under which a write lock will be needed, thereby minimizing the circumstances under which a write lock cause blocking of other threads.

Thread 5 will also need to take a lock to the zone slice that it seeks to write in. Here, thread 5 will need to place its request to obtain a lock 404a on slice a in wait queue 442 since thread 3 is already holding a lock 404a to slice a.

Figure 4D:
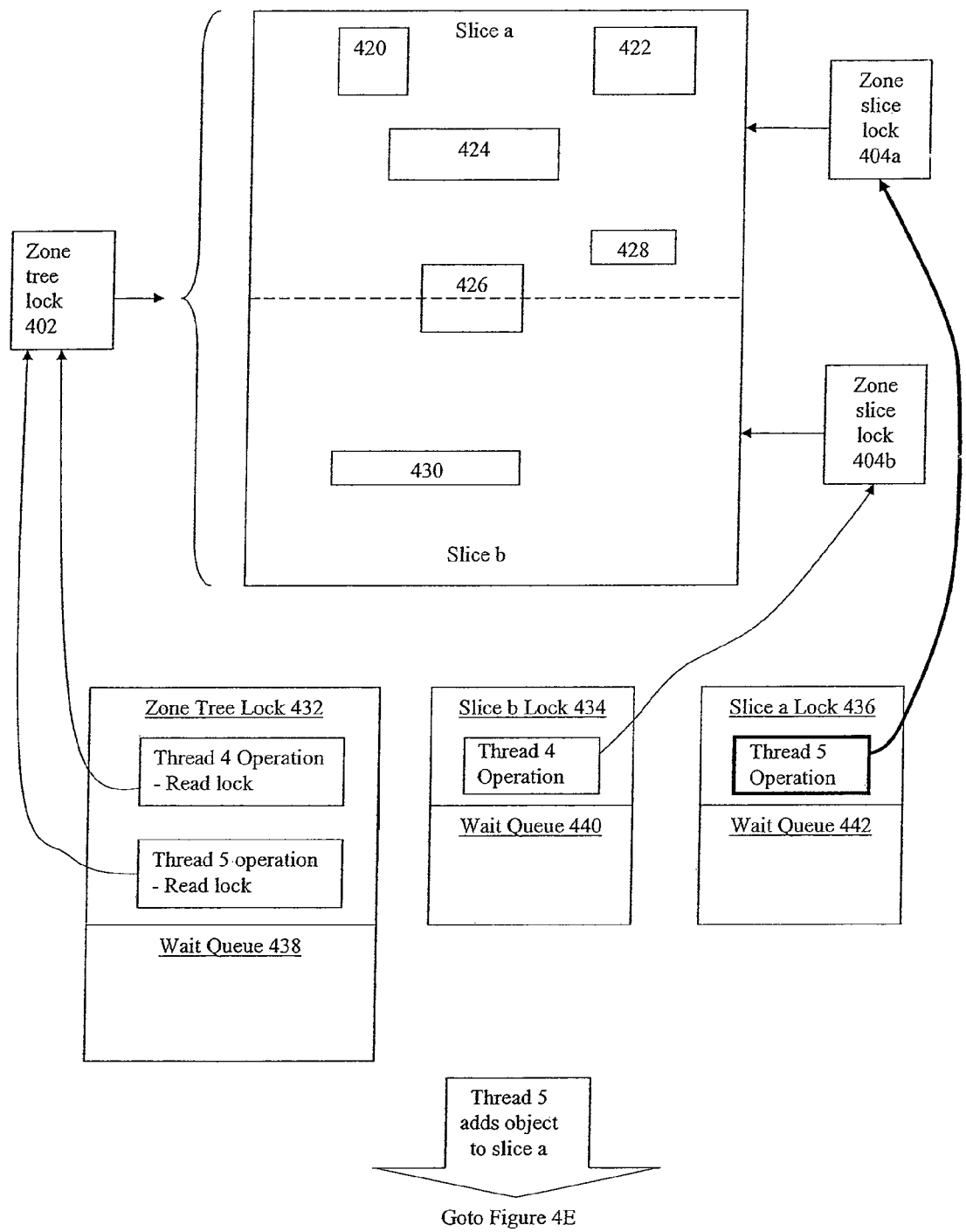

Assume that thread 3 completes it processing in slice a. As shown in FIG. 4D, since thread 3 has finished its operation and has released its lock on slice a, thread 5 will be able to obtain a lock 404a on zone slice a. This is shown by its entry in section 436 identifying the holder of lock 404a as thread 5.

Figure 4E:
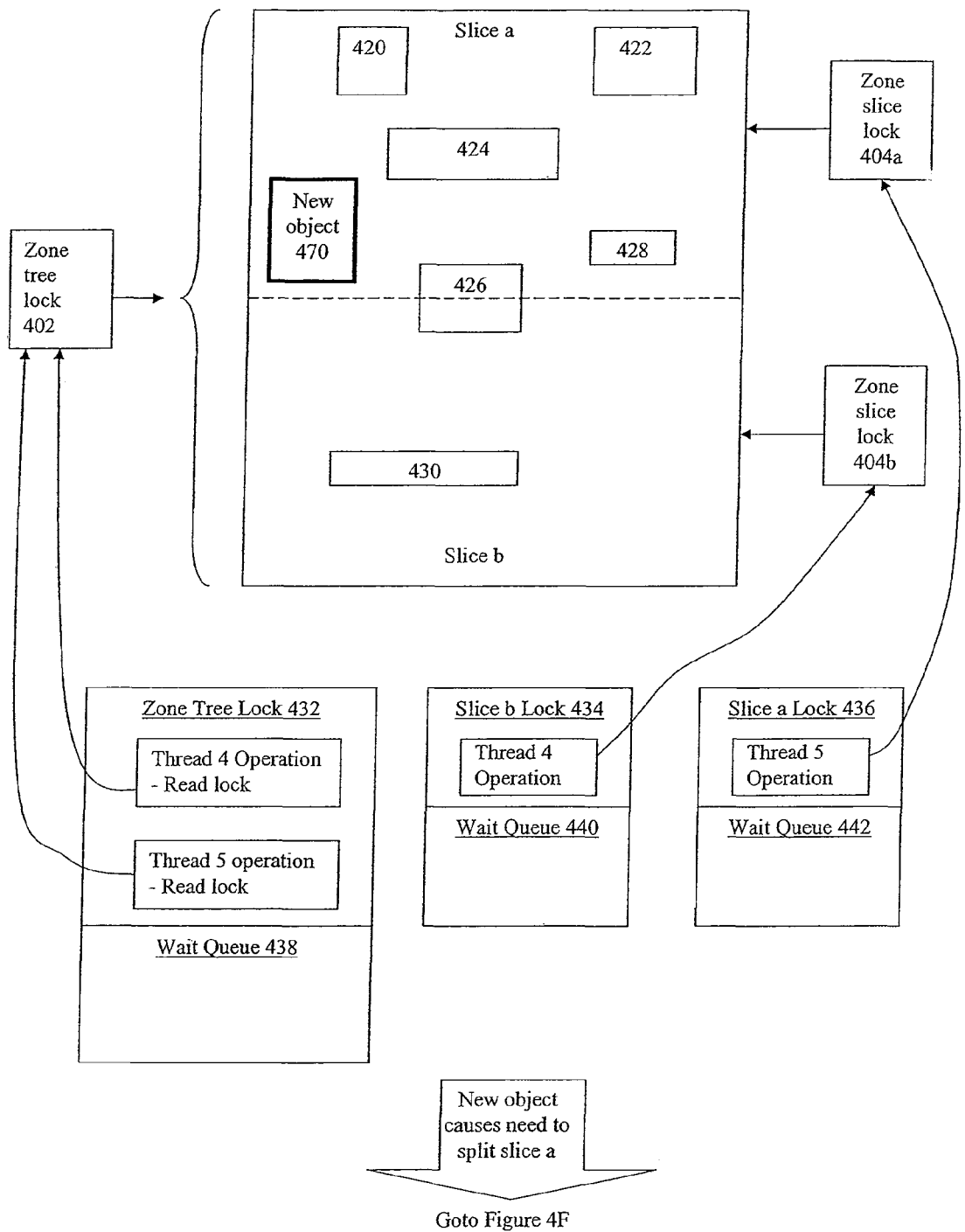

The write operation being performed by thread 5 will insert a new object 470 into slice a, as shown in FIG. 4E. Once thread 5 has completed its operations, it can release its locks to both the zone tree and zone slice.

Figure 4F:
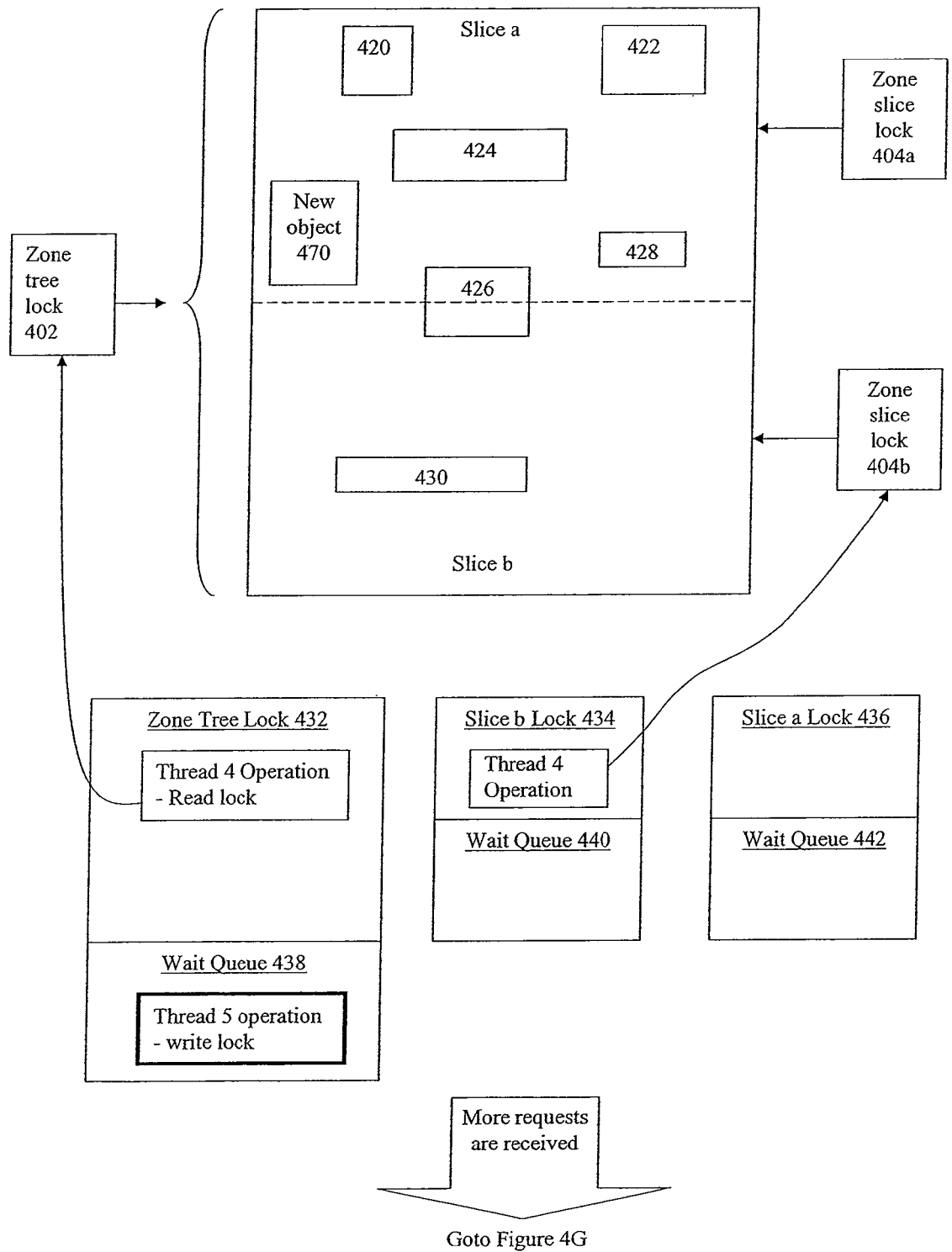

Assume that insertion of new object 470 into slice a will cause a requirement to split slice a, e.g., because slice a with the addition of object 470 has exceeded its size limitations. To split a zone slice, the thread 5 will be taking an exclusive write lock 402 to the corresponding zone tree. The exclusive write lock can be taken by thread 5 only if there are no other readers or writers that already have locks on the zone tree. In the present example, thread 4 holds an existing read lock 402 on the zone tree. Therefore, as shown in FIG. 4F, the request for an exclusive write lock by thread 5 cannot be immediately granted, but needs to be added to the wait queue 438.

It is possible that multiple threads have performed operations that would cause the need to split a slice in the zone tree. In this situation, it is possible that multiple requests will be queued to split the same slice. This means that by the time the later split operation reaches the front of the queue to take a write lock, an earlier split operation has already performed the required split. To address this situation according to one embodiment of the invention, the request is configured to check whether a previous request has already been processed to perform the desired split. If so, then the present requested is dequeued without performing a split.

Figure 4G:
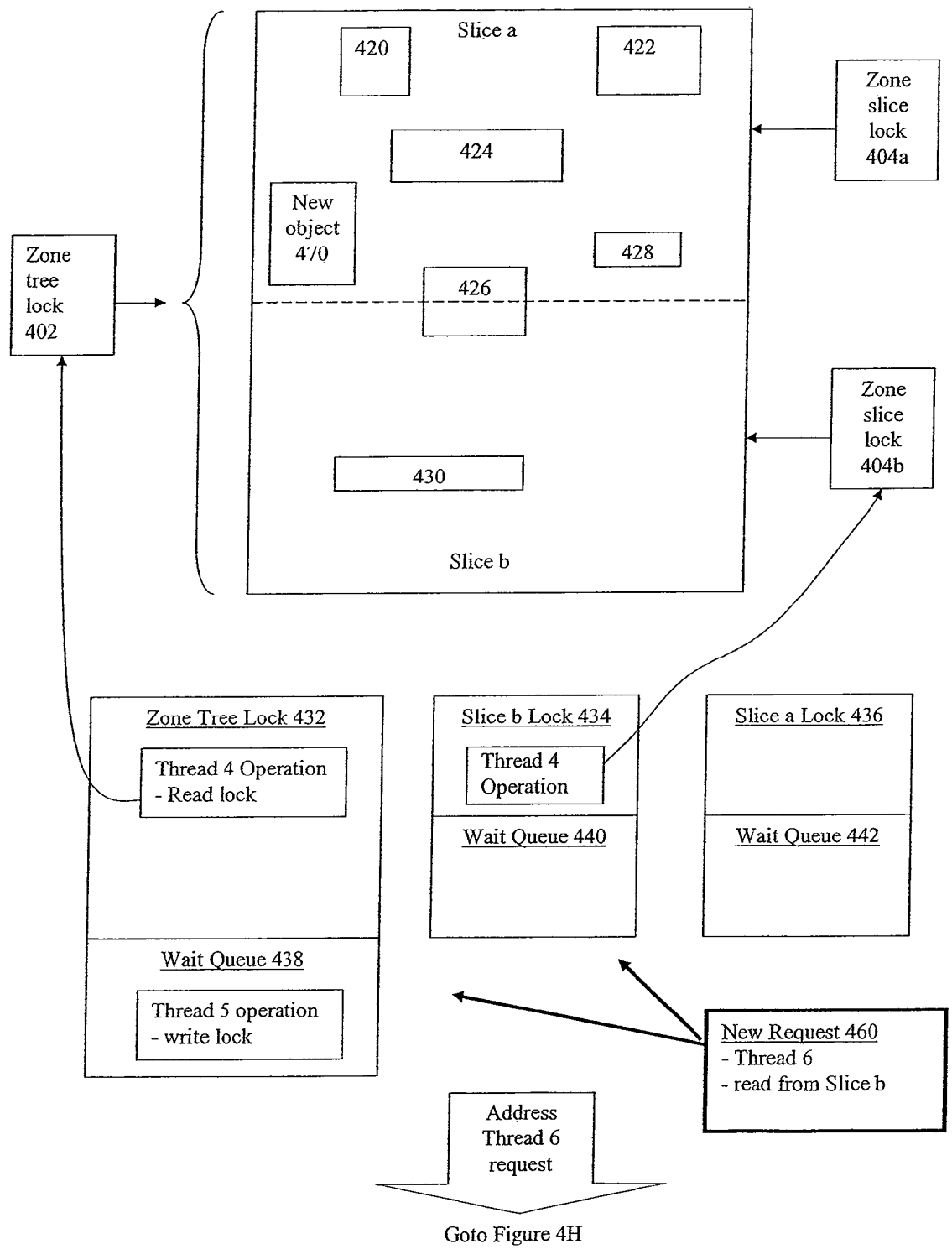

While the request by thread 5 to obtain a write lock on the zone tree is still waiting in queue 438, assume that an additional request is subsequently received from to acquire locks on these slices. For example, as shown in FIG. 4G, a new request 460 may be received from a thread 6 to read data from zone slice b. This means that thread 6 is requesting to hold locks for both the zone tree and the zone slice b.

Figure 4H:
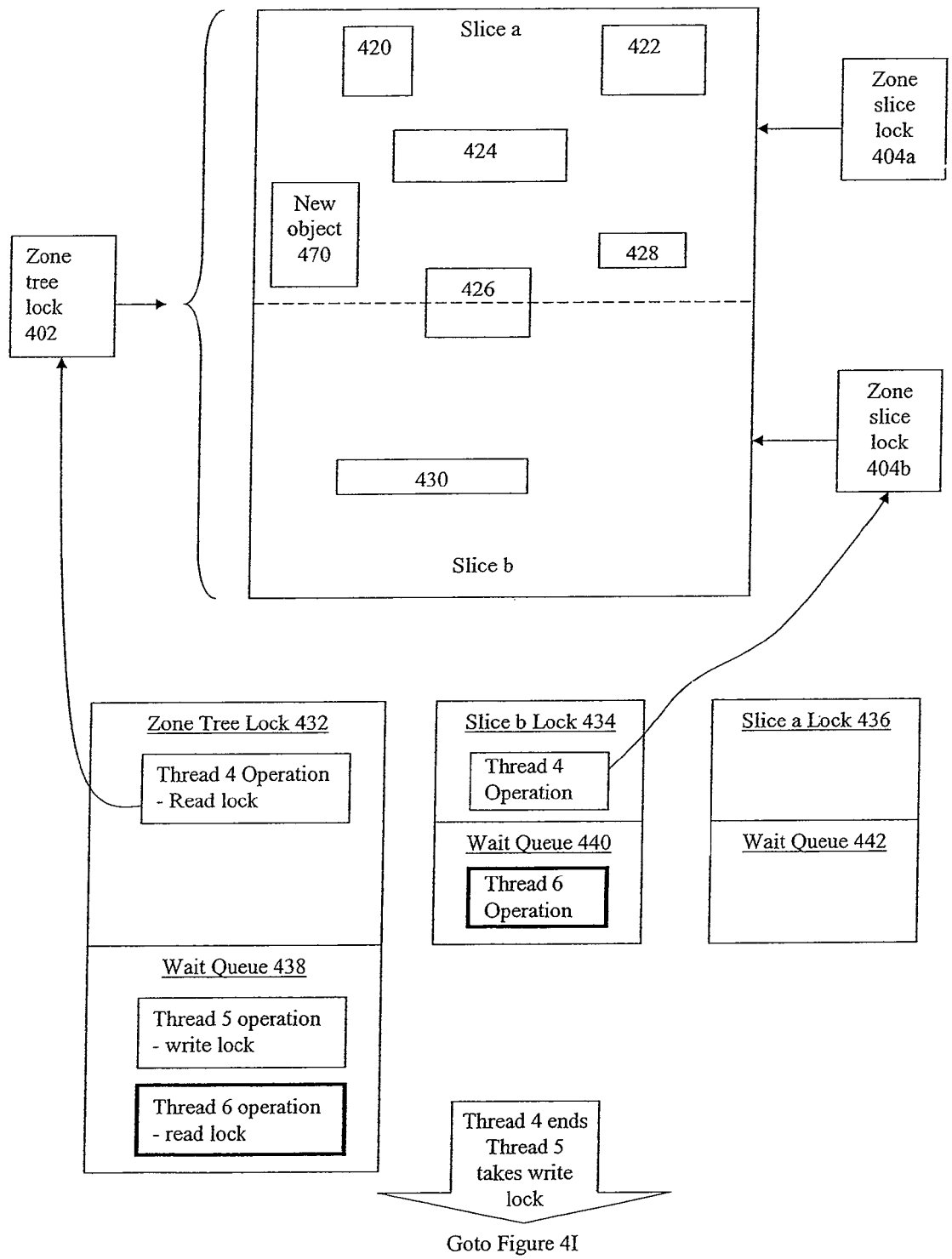

As shown in FIG. 4H, the request from thread 6 for a lock on the zone tree is queued in wait queue 438. Since there is already a write request from thread 5 for the zone tree that is ahead of the request from thread 6, thread 6 will need to wait until thread 5 has completed its operation, unless thread 6 has been designated as having sufficient priority to jump past thread 5 in the queue. Since thread 6 is unable to presently obtain a lock on the zone tree, its request for a lock on the zone slice b will also be queued in wait queue 440.

Figure 4I:
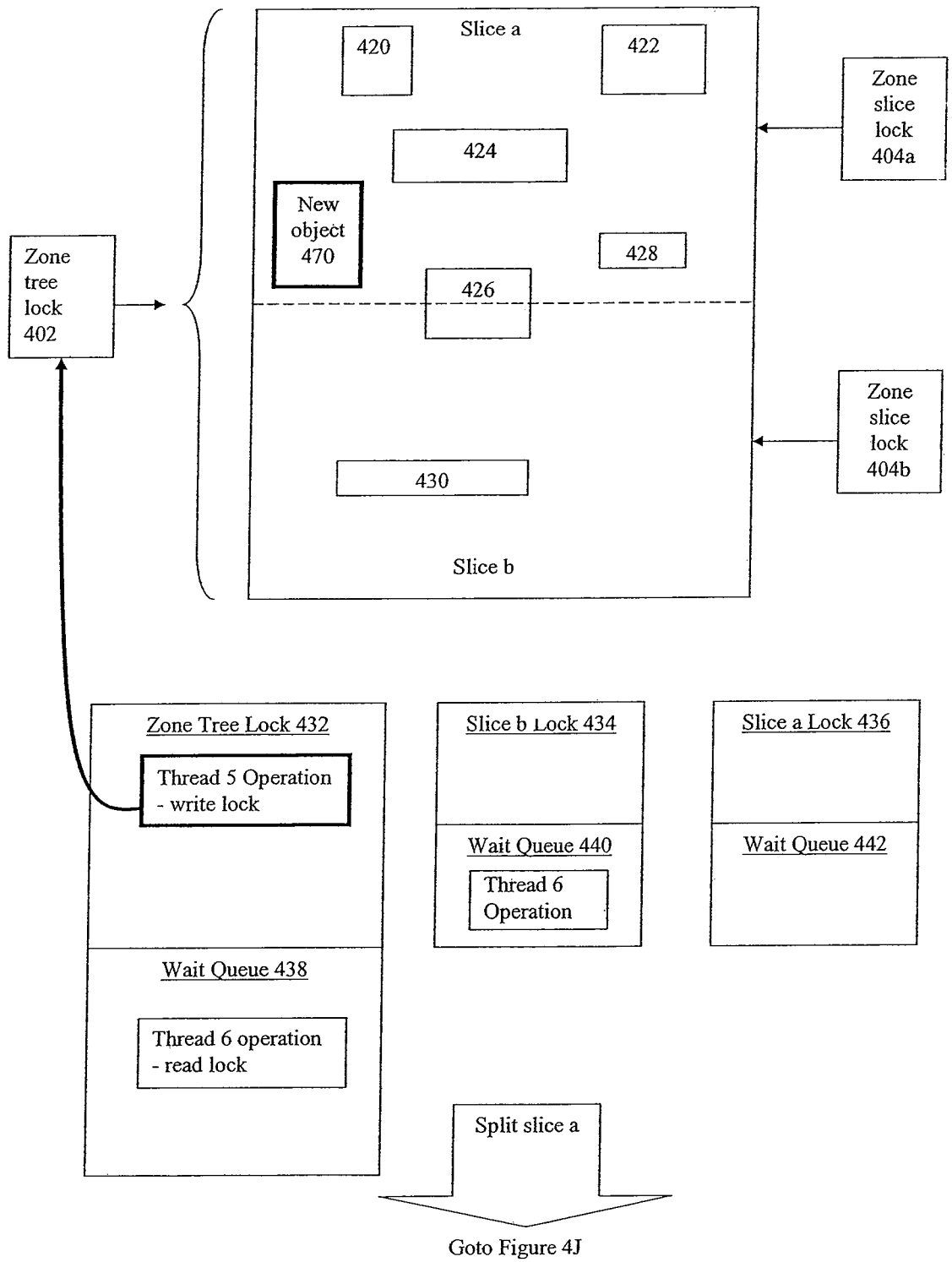

At this point, assume that thread 4 completes its processing and has released the locks 402 and 404b that it holds on the zone tree and zone slice b, respectively. As shown in FIG. 4I, the request by thread 5 to obtain a write lock 402 on the zone tree will now be granted. Thread 5 will be able to perform its desired operation to split slice a.

Figure 4J:
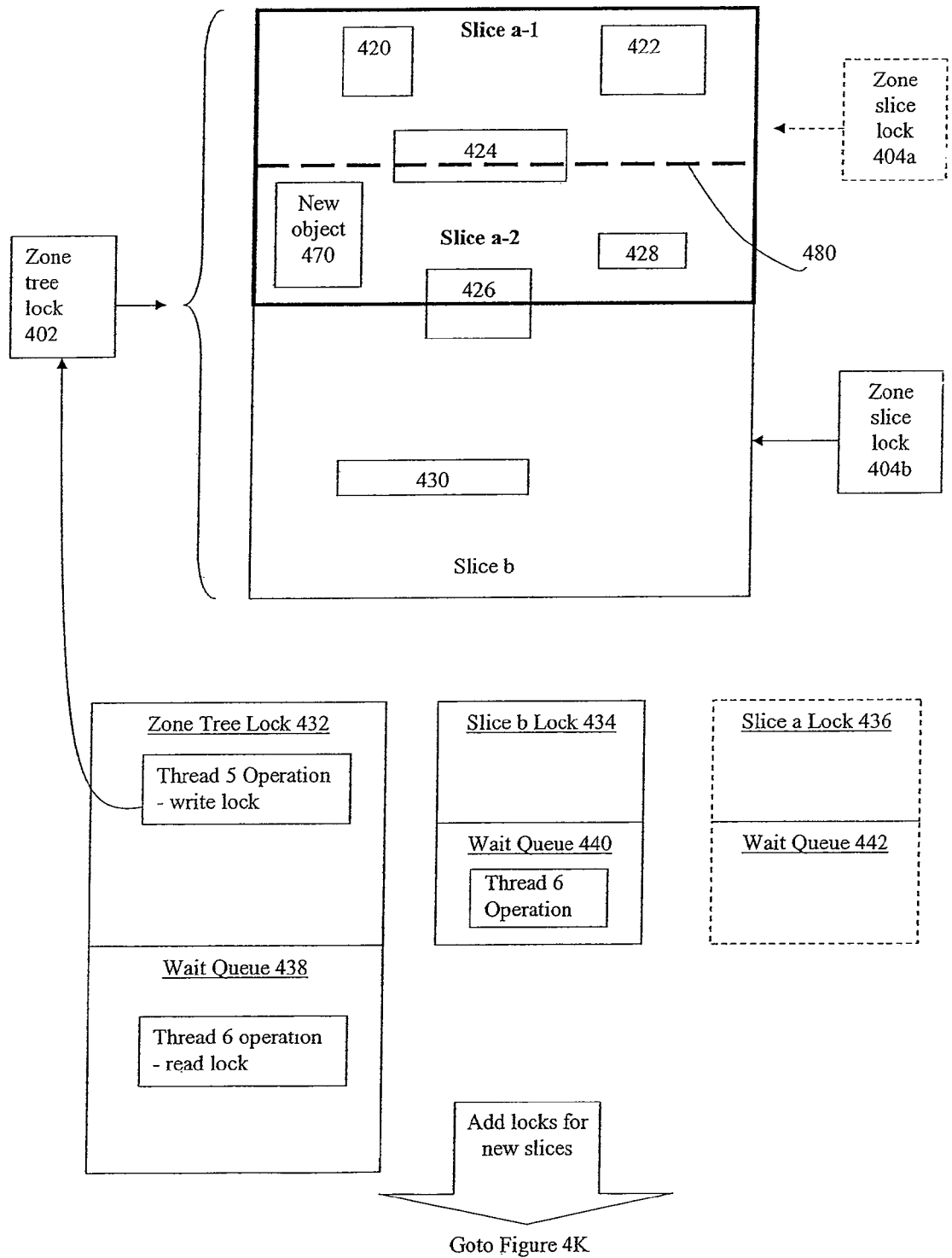
Figure 4K:
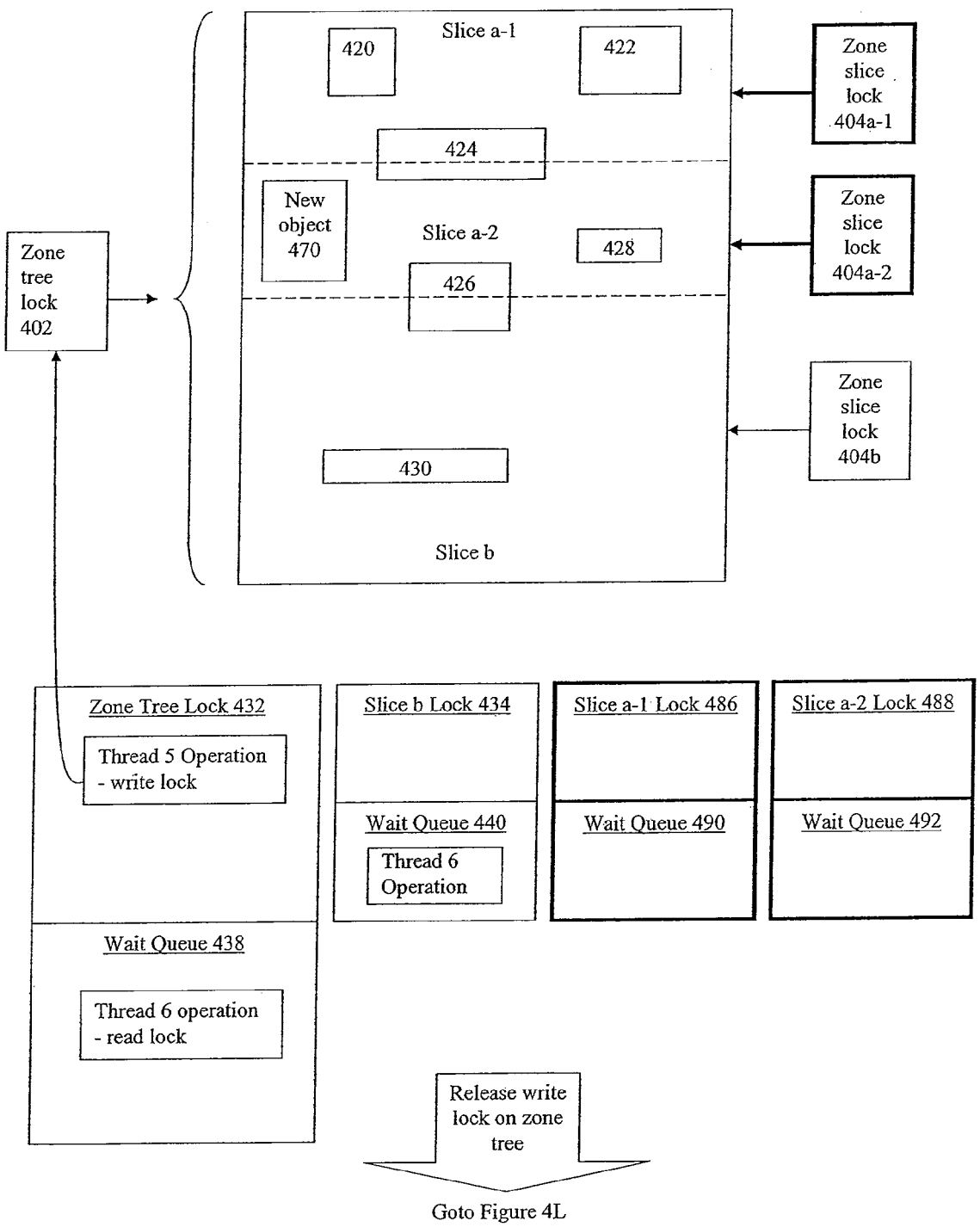

Referring to FIG. 4J, slice a will be split along horizontal divider 480 into two slices a-1 and a-2. According to an embodiment, the existing lock 404a on pre-split slice a will be invalidated since slice a no longer exists. Instead, as shown in FIG. 4K, new locks 404a-1 and 404a-2 will be formed that correspond to slices a-1 and a-2, respectively. Section 488 and wait queue 492 will be created to handle requests for zone slice a-1. similarly, section 486 and wait queue 490 will be created to handle requests for zone slice a-2. According to an alternate embodiment, original slice a will be retained as either slice a-1 or a-2, with previous lock 404a being retained as either lock 404a-1 or 404a-2.

Figure 4L:
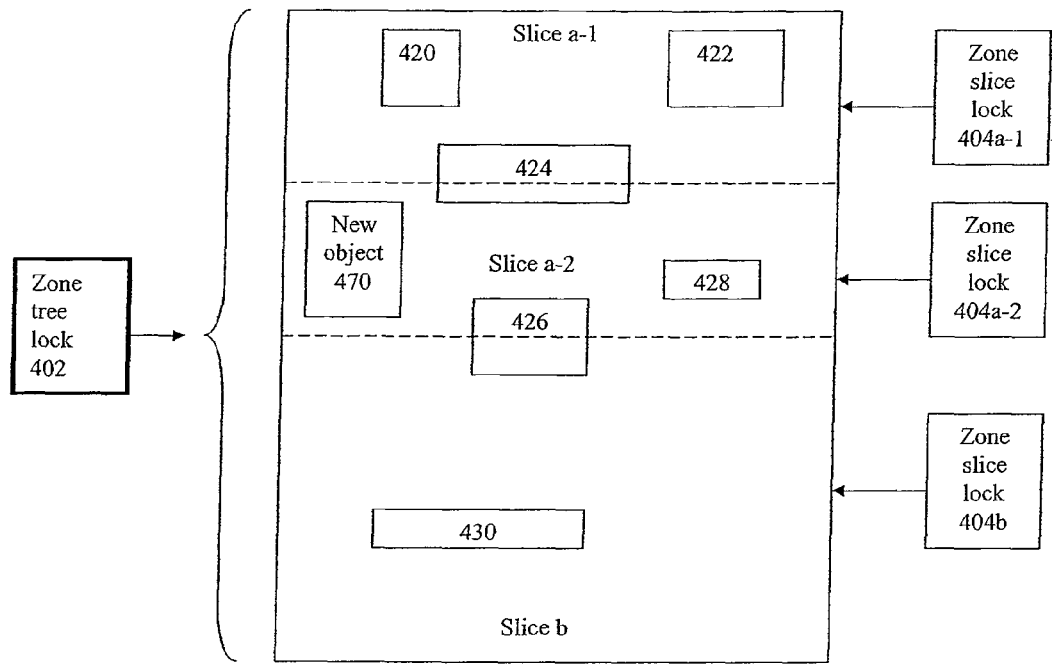
Figure 4L:
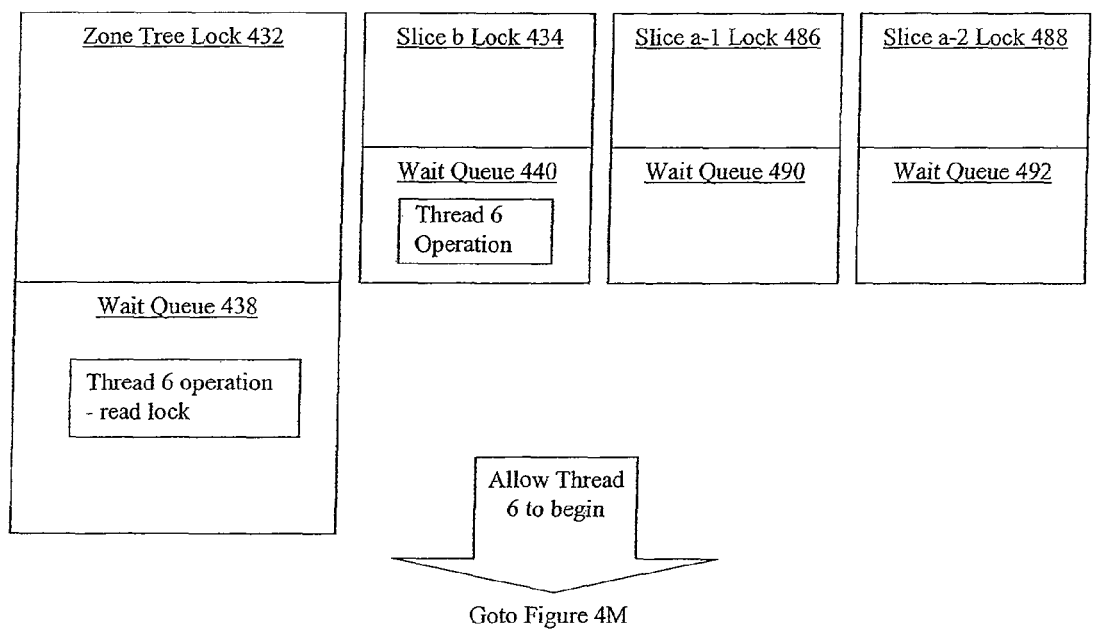
Figure 4M:
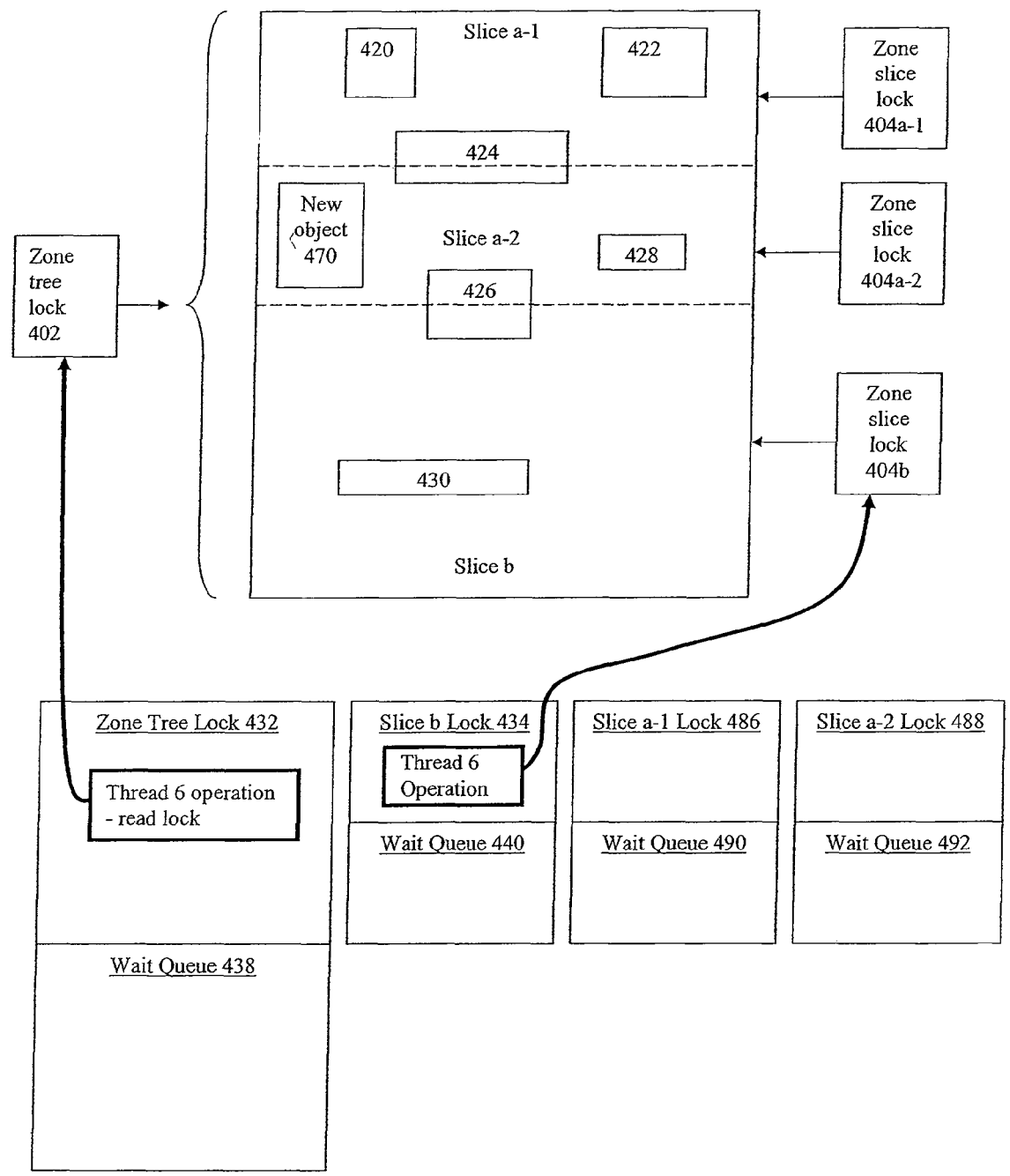

With the completion of these tasks and its processing operations, thread 5 will release its write lock 402 on the zone tree, as shown in FIG. 4L. Since there is no longer a write lock actively being held by thread 5 on the zone tree, then as shown in FIG. 4M, thread 6 will be able to obtain a read lock 402 on the zone tree. As a result, thread 6 will also be able to obtain the lock 404b on the zone slice b.

Therefore, what have been described are improved approaches to implement locking to facilitate parallel processing of EDA operations.

System Architecture Overview

Figure 5:
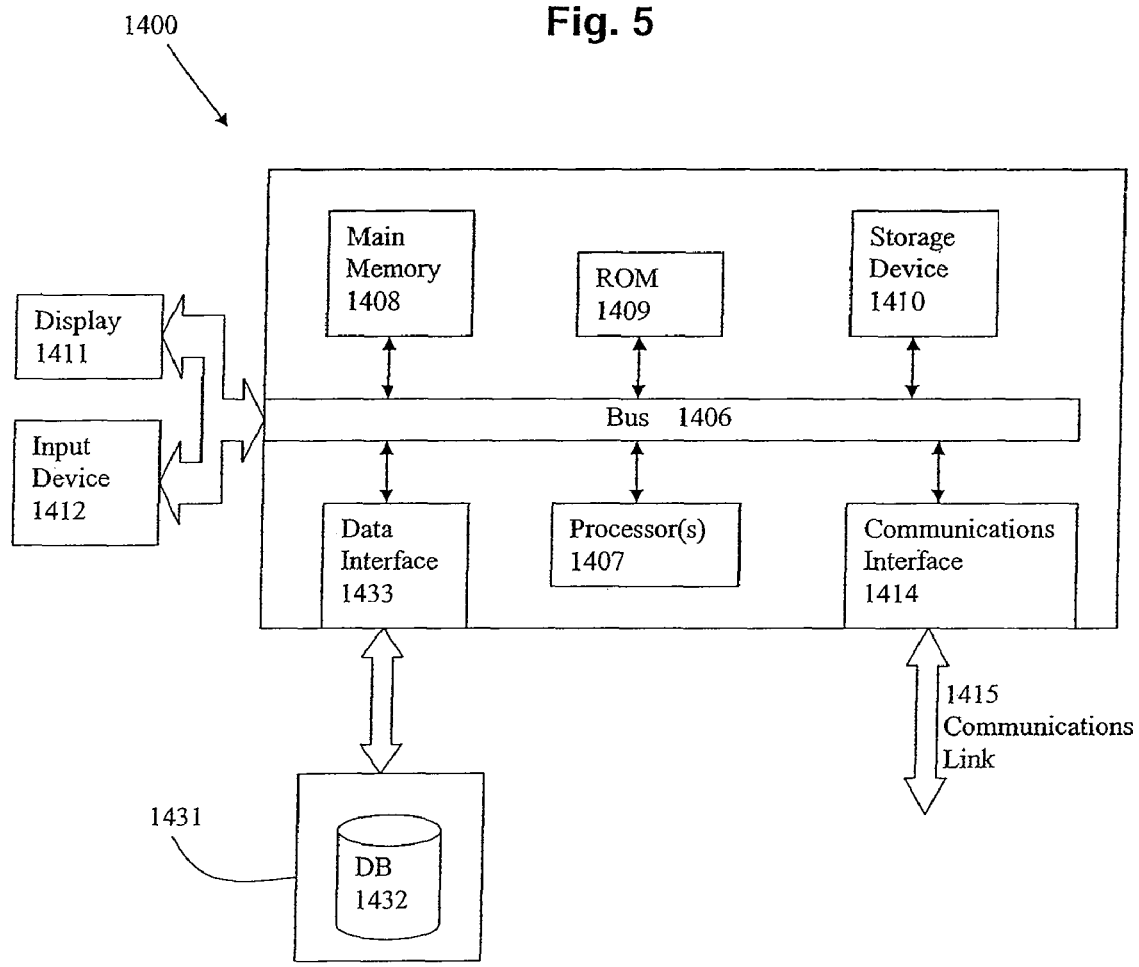
FIG. 5 illustrates an example computing architecture with which the invention may be implemented.

FIG. 5 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer implemented method for utilizing locks to process circuit designs, comprising:
   identifying a portion of an electronic design that is to be operated upon to process the electronic design, the electronic design corresponding to multiple design layers;
   identifying a lock that corresponds to a purpose pair of the portion of the electronic design, the lock being a member of a set of locks that is used to lock the electronic design, the set of locks organized at levels of granularities such that the lock corresponds to its own purpose pair associated with a specific layer and a specific purpose;
   acquiring the lock for the purpose pair on behalf of a first processing entity, wherein there are a plurality of processing entities concurrently operating using one or more processors to process the electronic design, the lock corresponding to the purpose pair of a layer and a purpose on the layer related to the portion of the electronic design; and
   processing, by using the first processing entity, the portion of the electronic design once the lock has been acquired.

2. The method of claim 1 in which the first processing entity is a thread.

3. The method of claim 1 in which the portion of the electronic design is a layout portion and the first processing entity performs verification or design entry for layout structures in the layout portion.

4. The method of claim 1 in which the purpose corresponds to a via purpose, wire purpose, blockage purpose, pin via purpose, or pin wire purpose.

5. A system for utilizing locks to process circuit designs, comprising:
   a computer-based system that is configured for processing multiple processing operations concurrently, the multiple processing operations being performed by multiple processing entities;
   a set of locks corresponding to an electronic design, the set of locks organized at levels of granularities such that one or more locks from the set of locks corresponds to a purpose pair associated with a specific layer and a specific purpose within the electronic design; and
   a first processing entity that acquires a lock on a portion of the electronic design, the lock corresponding to a layer and a purpose on the layer related to the portion of the electronic design.

6. The system of claim 5 in which the first processing entity is a thread.

7. The system of claim 5 in which the portion of the electronic design is a layout portion and the first processing entity performs verification or design entry for layout structures in the layout portion.

8. The system of claim 5 in which the purpose corresponds to a via purpose, wire purpose, blockage purpose, pin via purpose, or pin wire purpose.

9. A computer program product comprising a volatile or non-volatile computer-usable storage medium having executable code to execute a process by a processor for utilizing locks to process circuit designs, the process comprising:
   identifying a portion of an electronic design that is to be operated upon to process the electronic design, the electronic design corresponding to multiple design layers;
   identifying a lock that corresponds to a purpose pair of the portion of the electronic design, the lock being a member of a set of locks that is used to lock the electronic design, the set of locks organized at levels of granularities such that the lock corresponds to its own purpose pair associated with a specific layer and a specific purpose;

acquiring the lock for the purpose pair on behalf of a first processing entity, wherein there are a plurality of processing entities concurrently operating to process the electronic design, the lock corresponding to the purpose pair of a layer and a purpose on the layer related to the portion of the electronic design; and processing, by using the first processing entity, the portion of the electronic design once the lock has been acquired.

10. The product of claim 9 in which the first processing entity is a thread.

11. The product of claim 9 in which the portion of the electronic design is a layout portion and the first processing entity performs verification or design entry for layout structures in the layout portion.

12. The product of claim 9 in which the purpose corresponds to a via purpose, wire purpose, blockage purpose, pin via purpose, or pin wire purpose.

* * * * *